United States Patent [19]
Griffiths

[11] Patent Number: 5,127,921
[45] Date of Patent: Jul. 7, 1992

[54] MULTISTAGE RECRYSTALLIZATION FOR SUPERPURIFYING CRYSTALLIZABLE SUBSTANCES

[76] Inventor: Kenneth F. Griffiths, 415 Whitewater Ave., Fort Atkinson, Wis. 53538

[21] Appl. No.: 668,392

[22] Filed: Mar. 13, 1991

Related U.S. Application Data

[63] Continuation of Ser. No. 225,304, Jul. 28, 1988, abandoned.

[51] Int. Cl.⁵ .................. C30B 7/08; C30B 35/00
[52] U.S. Cl. .................. 23/295 R; 422/245
[58] Field of Search .......... 23/295 R–305 RE; 156/621, 624; 422/245, 252, 253, 251

[56] References Cited

U.S. PATENT DOCUMENTS

| Re. 32,241 | 9/1986 | Saxer | 62/542 |
|---|---|---|---|
| 2,147,222 | 2/1939 | Treub | 23/296 |
| 2,835,598 | 5/1958 | Kolner | 23/295 R |
| 2,851,368 | 9/1958 | Findlay | 422/251 |
| 3,128,188 | 4/1964 | McIntire | 99/48 |
| 3,337,307 | 8/1967 | Kuster | 23/295 R |
| 3,393,055 | 7/1968 | Stevenson | 23/295 R |
| 3,442,801 | 5/1969 | Anderson | 422/245 |
| 3,599,701 | 8/1971 | Mollerstedt et al. | 23/295 R |
| 3,992,900 | 11/1978 | Campbell | 62/541 |
| 4,143,524 | 3/1979 | Thijssen | 62/542 |
| 4,338,109 | 7/1982 | Thijssen et al. | 62/541 |
| 4,406,679 | 9/1983 | Wrobel et al. | 62/541 |
| 4,430,104 | 2/1984 | Van Pelt et al. | 62/542 |
| 4,508,553 | 4/1985 | Thijssen et al. | 62/541 |
| 4,557,741 | 12/1985 | Van Pelt | 62/541 |
| 4,588,414 | 5/1986 | Takeyami et al. | 23/295 R |
| 4,666,456 | 5/1987 | Thijssen et al. | 23/296 |

Primary Examiner—R. Bruce Breneman
Attorney, Agent, or Firm—Lockwood, Alex, Fitzgibbon & Cummings

[57] ABSTRACT

A method and apparatus are provided for superpurifying crystallizable substances to a purity level of 99.999 percent. Included is controlling the reflux ratio by controlling and/or metering transfers of crystals and mother liquor at selected locations and by maintaining a steady state of transfers between a plurality of stages that carry out similar operations.

22 Claims, 3 Drawing Sheets

MULTISTAGE RECRYSTALLIZATION FOR SUPERPURIFYING CRYSTALLIZABLE SUBSTANCES

This application is a continuation of application Ser. No. 225,304, filed Jul. 28, 1988, now abandoned.

BACKGROUND AND DESCRIPTION OF THE INVENTION

The present invention generally relates to multistage recrystallization, and more particularly to a multistage recrystallization method and apparatus for superpurifying crystallizable substances to purify them to extremely high levels, typically on the order of 99.999 percent purity. Reflux ratio conditions are controlled closely, preferably in association with the establishment and maintenance of steady state conditions in each stage of the system, thereby facilitating generally automatic control of reflux ratio conditions by closely monitoring and metering selected material transfers, inputs and/or outputs for each stage of the system.

Purification of crystallizable materials by way of recrystallization techniques has been known and practiced for many years. Generally speaking, it is extremely difficult to remove trace impurities from crystallizable materials by recrystallization from a saturated solution therefor, or by other techniques including fractional crystallization and fractional freezing procedures. Included are zone-refining procedures which typically would increase product purity by adding recrystallization stages, but this would be done at the expense of the percentage yield of product that is formed at the last or purest recrystallization stage. For example, it is well known to use fractional crystallization in separating radium chloride from barium chloride by a classic separation procedure that utilizes a complicated grid pattern of many dozens of separate evaporation dishes or crystallizers. Under this procedure, the crystal crop of each crystallizer is transferred to the adjacent crystallizer in one direction, while the mother liquor is transferred in the opposite direction. Although increasing concentrations of radium chloride follow movement of the crystal crop from one crystallizer to the next, a very large number of crystallizers are required, and operating costs for this type of system are very high.

Generally speaking, currently available applications for fractional crystallization have recognized the desirability of operating at an optimum reflux ratio while not necessarily effectively providing suitable specifics for implementing this desirable approach.

The multistage recrystallization art includes multi-step recrystallization systems for separating fluid material having two or more different components. For example, U.S. Pat. No. Re. 32,241 describes having a component crystallize on a cooled surface as material containing the component flows theredown. In this patent, a solution of a given stage is used to wash the crystals formed in that stage before those crystals are transferred to the next purer stage. This wash solution is the solution that is in this stage at a time immediately preceding the crystallization of any material therefrom. In an embodiment of that patent, the crystals are transferred to the next purer stage as soon as appropriate valves cause the liquid of the next purer stage to contact and dissolve the crystals. The wash solution, which is used to wash the crystal crop of a given stage, is the purest part of the solution present in that given stage before any material is crystallized from it.

Publications such as U.S. Pat. No. 4,666,456 describe what are essentially a single stage crystallization systems. This particular patent shows continuous partial crystallization of a compound from a liquid mixture in which the mixture is fed through a cascade of a plurality of cooling sections. These cooling sections are connected in series, and the temperature of each subsequent one of the cascading cooling sections is lower than that of the preceding one.

It has been found that, by proceeding in accordance with the present invention, it is possible to achieve superpurification of crystallizable substances by removal of certain impurities therefrom through a multistage recrystallization procedure that achieves purity levels on the order of 99.999 percent with extremely high yields that are exceptional for multistage recrystallization procedures. Included is an effective manner of controlling reflux ratio conditions while achieving and maintaining steady state operating conditions.

In summary, the present invention is a method and apparatus for superpurifying crystallizable substances by a multi-stage recrystallization procedure which includes measures to control reflux ratio conditions by providing metering procedures that control quantities of crystals and mother liquor reflux materials that are transferred according to the method and apparatus. In each stage, a crystallizable substance is dissolved within a solvent or an unsaturated solution to form a new solution and is then recrystallized from that new solution. Thereafter, the crystals are separated from the mother liquor. A controlled quantity of the mother liquor is metered, which may include transfer to a reflux receiver of that stage. In the least pure stage, this metered mother liquor provides a controlled quantity of byproduct. This metered mother liquor of the other stages is transferred to the crystals that had been separated from the crystal slurry of the next less pure stage in order to thereby wash same. Crystals collected in the purest stage provide a predetermined quantity of crystal product. A predetermined quantity of crystallizable material is fed to the least pure stage and another cycle is run. If desired, additional, similar stages may be provided in order to concentrate the byproduct in order to form a relatively large percentage of purified material and a smaller percentage of very impure material. This purified material can be used as feed material to the multistage recrystallization system.

It is a general object of the present invention to provide an improved method and apparatus for superpurifying crystallizable substances.

Another object of the present invention is to provide an improved superpurification system that utilizes multistage recrystallization that effectively, efficiently and very closely controls reflux ratio conditions.

Another object of the present invention is to provide an improvement in multistage recrystallization that can achieve and then maintain steady state conditions.

Another object of this invention is to provide improved superpurification of crystallizable substances by generally automatically metering inputs and outputs from the system and between stages of the system which maintain a gradient of differing purity levels.

Another object of this invention is to provide an improved multistage recrystallization system which achieves extremely high purification together with particularly high yields.

Another object of the present invention is to provide an improved apparatus and method for superpurification of crystallizable substances which includes the use of arrangements whereby a wash reflux from one stage of a multistage recrystallization system is used to displace residual mother liquor from crystals formed in a stage that is immediately adjacent to and that operates a lower purity levels than the stage from which the wash reflux originates.

Another object of the present invention is to provide a multistage recrystallization system wherein especially efficient and thorough separation of a minor ingredient from a major ingredient is effected.

Another object of this invention is to provide an improved apparatus and method that utilizes multiple stages and involves forming a new crystal crop in each stage from a mother liquor that is a saturated solution of the component being purified.

Another object of this invention is provide an improved multistage fractional crystallization system having a controlled reflux ratio such that the proper reflux ratio can be used to separate a minor ingredient having a given segregation coefficient.

Another object of the present invention is to provide an improved apparatus and method wherein reflux leaving a given stage of a multistage system is as impure as possible and such that the crystal material leaving that stage is as free of its mother liquor as possible in order to thereby maximize the separation efficiency of each stage.

These and other objects, features and advantages of this invention will clearly understood through a consideration of the following detailed description.

BRIEF DESCRIPTION OF THE DRAWINGS

In the course of this description, reference will be made to the attached drawings, wherein.

DESCRIPTION OF THE PARTICULAR EMBODIMENTS

Figure 1:
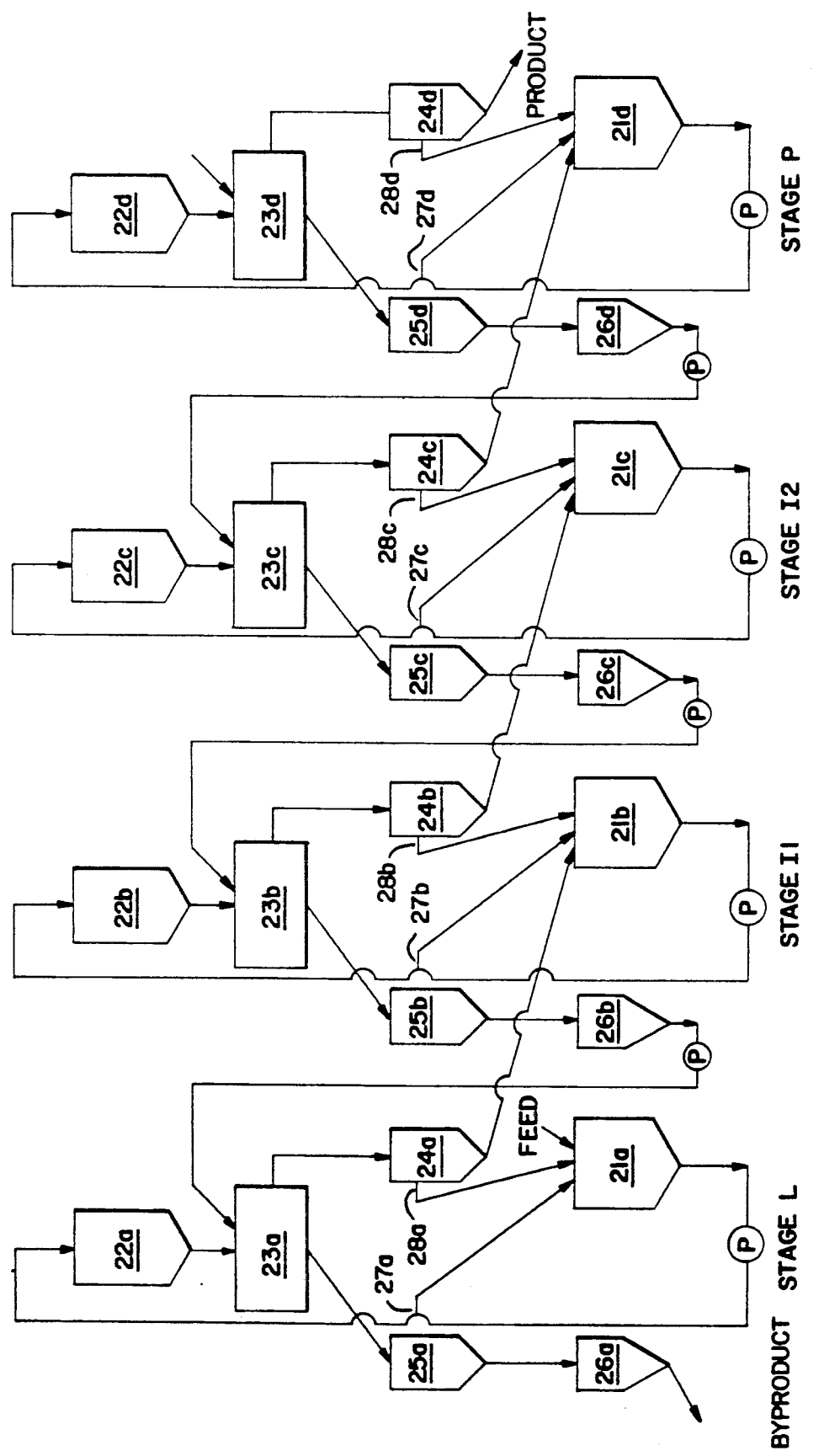
FIG. 1 is a generally schematic view or flow diagram of a multistage superpurification system according to this invention.

In the arrangement illustrated in FIG. 1, a multistage recrystallization system is shown to include four different stages, each of which processes substantially equal quantities of various components, but with different purity levels being maintained from stage to stage. In the illustrated embodiment, Stage L is the stage at which the crystallizable material therewithin is at a purity level that is the lowest among the stages illustrated in FIG. 1. Stage P is the stage at which the purity level is the highest, and Stage I1 and I2 have purities of intermediate degrees, meaning that both are purer than Stage L and less pure than Stage P, while Stage I2 is purer than Stage I1. These intermediate stages can be omitted, or additional intermediate stages can be added without significantly decreasing the yield of the multistage recrystallization system. In a typical situation, a superpurity level of on the order of 99.999 percent purity is attained with on the order of four intermediate stages. If even greater purity, or hyperpurity, is desired, six to eight or more intermediate stages could be utilized, although it must appreciated that the greater the number of intermediate stages, processing cost and time are increased. Flow rates between these various stages are substantially the same, and the flow rates are developed to ensure that there is enough solvent to dissolve the crystals within each cycle.

Each stage includes a collector 21a, 21b, 21c, 21d. This collector area or vessel can also function to dissolve, typically including heating, crystal materials within the solvent used in the system, although a separate crystal dissolver or heater assembly (not shown) can be provided as desired. The collector vessel is typically a heated vessel in which a charge of mother liquor and crystals may be heated sufficiently to dissolve the crystals to form a new solution, and in some cases this vessel may be used to evaporate a controlled weight of solvent from a batch of solution therewithin. Means such as the illustrated pump, or another suitable type of arrangement, can be used to transfer the new solution from the collector to a crystallizer 22a, 22b, 22c, 22d of each stage, wherein crystallization is effected, typically by a procedure that includes cooling. The crystallizer of each stage may be a chilled vessel to effect crystallization of appropriate portions of crystallizable material.

Downstream thereof, a separator 23a, 23b, 23c, 23d is provided in each stage for separating the crystal slurry into dewatered crystals and mother liquor. Each separator can take any suitable form, such as one utilizing gravitational separation, one that includes centrifuging procedures, and the like, as well as combinations thereof. The dewatered crystals in the separator can be transferred to a crystal receiver 24a, 24b, 24c, 24d, while the mother liquor present in the separator is transferred to a suitable mother liquor receiver 25a, 25b, 25c, 25d.

Means are then provided for metering a controlled quantity of the mother liquor from each mother liquor receiver. Such means for this location, or at other locations in the cycle, can take the form of proportioning pumps or the like (not shown) which are timed to convey a controlled volume and/or weight of each material to each stage during the proper time in the cycle. Other suitable assemblies or approaches could be used.

In the arrangement illustrated in FIG. 1, this metering function is accomplished by using a metering reflux receiver 26a, 26b, 26c, 26d, which may be a vessel suitable to receive and store a measured volume or weight of mother liquor. Each reflux receiver may be used in combination with a suitable arrangement for ensuring that a preselected volume and/or weight of mother liquor is transferred thereto. One arrangement could be to provide a suitable metering device wherein the flow into the metering reflux receiver can be monitored and controlled. Another arrangement could be to provide a liquid level responsive probe within the metering reflux receiver in order to detect when a certain volume of mother liquor is present therewithin. A further approach is to provide an overflow conduit 27a, 27b, 27c, 27d wherein excess or residual mother liquor within each mother liquor receiver is removed therefrom so that the controlled quantity of mother liquor can be transferred from the mother liquor receiver 25a, 25b, 25c, 25d to the metering reflux wash receiver 26a, 26b, 26c, 26d. Whatever arrangement is utilized, it is typically preferred to incorporate an adjustability function within the metering or controlling means so that the apparatus can be used for achieving different reflux ratios and/or for processing different crystallizable materials.

Means are further provided for transferring the thus metered or controlled volume and/or weight of mother liquor from each reflux wash receiver. In Stage L, this provides byproduct from Stage L, which byproduct can be further processed if desired in an appropriate multistage recrystallization concentration system which can be added upstream of Stage L or which can simply process the byproduct at a later time. Each stage of such a concentration system is similar to those shown in FIG. 1, and are shown in more detail in FIG. 3.

The other metered or otherwise controlled quantities of the mother liquor are transferred to the crystals of the next less pure stage in order to effect a washing of the crystals with a mother liquor having a purity greater than the mother liquor that remains with the crystals after operation of the separator 23a, 23b, 23c, 23d. Typically, this transfer will be in a manner such that this mother liquor will wash through the crystals, which can be readily accomplished by flowing this mother liquor into the separator. More specifically, the metered mother liquor from Stage I1 is transferred to separator 23a, the metered mother liquor from Stage I2 is transferred to separator 23b, and the metered mother liquor from Stage P is transferred to the separator 23c. Preferably, solvent of a predetermined quantity and temperature enters the separator 23d or the crystal receiver 24d in order to dissolve enough of those crystals to make up the required amount of reflux solution for Stage P and also to wash the Stage P crystal product.

Crystal material is transferred from each crystal receiver or the like to the collector or its equivalent of the next purer stage. In the case of the crystal receiver 24d, the crystals removed therefrom constitute the superpurified crystal product according to the invention. In a preferred embodiment, the quantity of this product is metered or controlled by suitable means, such as means of the type that are described hereinabove in connection with metering or controlling the mother liquor reflux operation. The drawings illustrate an excess or residual crystal transfer conduit 28a, 28b, 28c, 28d wherein any excess crystals within the crystal receiver can be transferred to the collector or the like of that same stage so that these crystals can be recrystallized and not lost and so that the reflux ratio and steady state conditions of the system are not disrupted. For example, conduit 28a transfers excess crystals from the crystal receiver 24a to the collector 21a, and substantially the same transfer can be practiced in each of the other stages of the system.

Depending upon the particular metering means utilized, transfer of the excess crystals out of the crystal receivers can take place before or after transfer of the metered amount of crystals. The transfer of the metered weight and/or volume of crystals is to the next purer stage to a location at which these crystals will next be subjected to further recrystallization and further purification. In the embodiment illustrated in FIG. 1, this transfer includes metered movement of crystals from crystal receiver 24a to collector 21b, from crystal receiver 24b to collector 21c and from crystal receiver 24c to collector 21d.

Whatever materials are then present in each collector are then combined into the new solution and transferred to the crystallizer of that same stage in order to thereby effect recrystallization from the new solution of each respective collector. As for the least pure collector 21a, part of its input is the feed of recrystallizable material, which again can be metered as needed in order to maintain the reflux ratio and steady state conditions of the system. The materials then present within the collector 21a are transferred by suitable means such as the illustrated pump to the crystallizer 22a. Similarly, materials within collector 21b are transferred to crystallizer 22b, and so forth for each stage of the system.

Preferably, withdrawal of the mother liquor reflux from the crystallization vessel in which it is formed is conducted after crystallization of a given mass has been completed. This provides the greatest possible difference in purity between the crystals and the withdrawn reflux of any given stage. This maximizes the separation efficiency of each stage.

Figure 2:
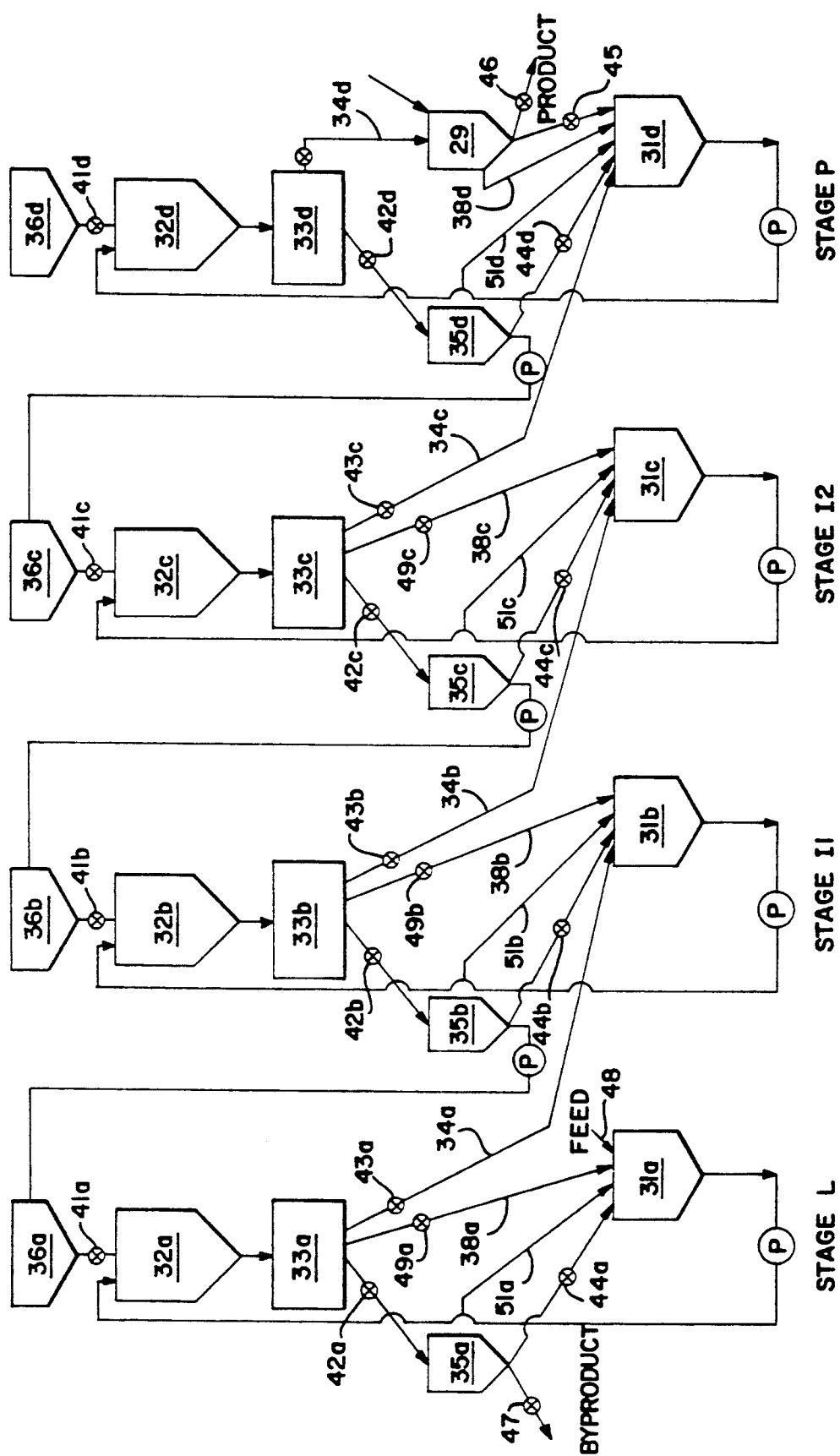
FIG. 2 is a generally schematic view or flow diagram of an alternative embodiment for carrying out the multistage recrystallization superpurification according to the present invention.

FIG. 2 illustrates another embodiment of the invention that specifies other ways of realizing the objectives of the invention. Again, four stages are illustrated, Stage L, Stage I1, Stage I2 and Stage P. Each of these stages has substantially the same attributes as discussed herein with respect to the FIG. 1 embodiment. Each stage includes a collector 31a, 31b, 31c, 31d, a crystallizer 32a, 32b, 32c, 32d, and a separator 33a, 33b, 33c, 33d, each of which operate in much the same manner as the similarly designated components of the FIG. 1 embodiment.

Rather than providing a separate crystal receiver of the type illustrated in FIG. 1, the needed quantity of crystals are transferred from the separator of one stage to the collector of the next purer stage through a conduit 34a, 34b, 34c. Such crystal flow can be facilitated by a pump and/or metering device as generally discussed herein and as generally illustrated in FIG. 2. Transfer of these crystals from separator 33a passes to collector 31b, while crystals from separator 33b pass to collector 31c, and crystals from collector 33c pass to collector 31d. In the illustrated embodiment, one crystal receiver 29 is included. Desired product is transferred therefrom through conduit 46.

Excess crystal material from each stage, preferably together with wash material as discussed hereinafter, passes to the collector of that same stage for subsequent recrystallization within the crystallizer of that stage. In Stage L, Stage I1 and Stage I2, this transfer is effected directly from separator 33a, 33b, 33c through conduit 38a, 38b, 38c, and to the collector 31a, 31b, 31c, respectively, of that stage. In Stage P, this transfer is illustrated as being from the crystal receiver 29, through conduit 38d and to collector 31d.

Material within each collector 31a, 31b, 31c, 31d is transferred to the respective crystallizer for each stage, as illustrated. In this embodiment, mother liquor from the mother liquor receiver 35a is transferred as byproduct, whereas mother liquor from receivers 35b, 35c, 35d is transferred to a reflux wash receiver 36a, 36b, 36c. Substantially pure solvent can be introduced into the reflux wash receiver 36d, if desired. Metering means such as valves, pumps and the like can be positioned at 49a, 49b, 49c to permit drainage of reflux wash from the crystals, which are washed within the separator 33a, 33b, 33c, 33d.

With more particular reference to the operation of the FIG. 2 embodiment, valves 41a, 41b, 41c, 41d or the like can be provided to control the rate of drainage of reflux wash from the reflux wash receiver of each stage and into the crystallizer of that stage. Valves 42a, 42b, 42c, 42d or the like are provided to control the drainage of mother liquor from the separator of each stage to its mother liquor receiver. As generally previously discussed, valves 43a, 43b, 43c or other suitable metering means are provided to permit control of transfer of crystals from the separator of each stage to the collector of the next purer stage or, in the case of metering means 34d, to the crystal receiver 29. Valve or other metering means 44a, 44b, 44c, 44d, can be provided to control drainage of mother liquor from the mother liquor receiver to the collector of that same stage. Means 45 controls transfer of excess crystal material to the collector of the purest stage, and means 46 controls transfer of product out of the multistage system illustrated in FIG. 2. Metering means 47 can be provided for controlling the flow of byproduct out of the system, in this case from the mother liquor receiver 35a. Feed into the system can be through transfer means 48, which opens into the collector 31a in the least pure stage.

Means such as overflow conduits 51a, 51b, 51c, 51d are provided to permit transfer of excess or overflow mother liquor from the mother liquor receiver of each stage and into the collector of that same stage. Overflow conduit 38d can be used to transfer overflow crystals from the crystal receiver 29 to the collector 31d of the purest stage. These overflow means can function to determine the volume of holdup to be retained in the mother liquor receiver or crystal receiver by virtue of its level within such receiver.

Figure 3:
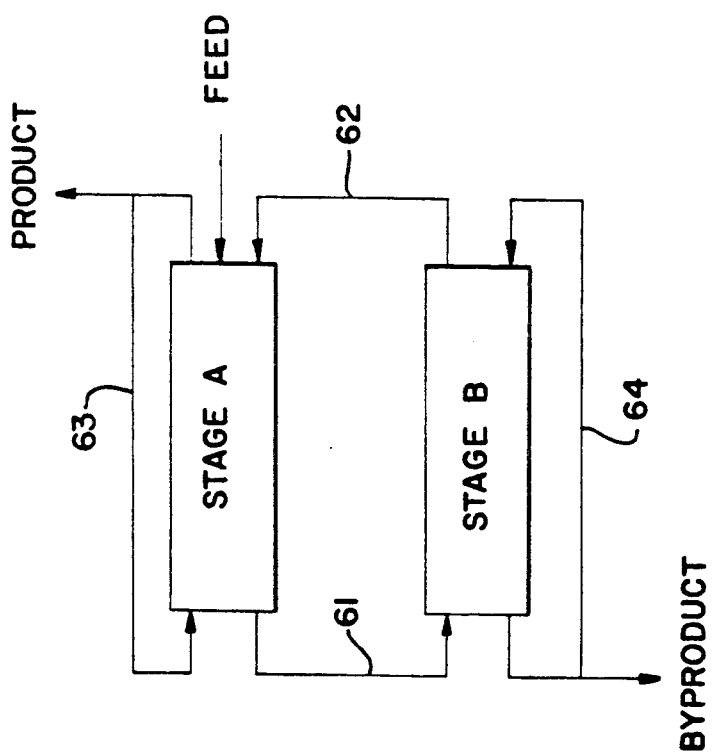
FIG. 3 is a schematic illustration of an embodiment of a multistage impurity concentrating system useful with the invention.

With reference to FIG. 3, an impurity concentration system having two stages is illustrated. Again, additional stages can be added as desired. Details of the components of each stage are generally in accordance with that shown in FIG. 1, FIG. 2, or equivalents thereof. Generally speaking, the impurity concentrating section can be provided for the purpose of concentrating the impurities in the byproduct from Stage L into a small portion of very impure new byproduct and a larger portion of purified material which is suitable for providing some of the feed to Stage L. This typically improves the yield of the total system, particularly where the product from the impurity concentrating section is returned to Stage L as feed material. This can be facilitated by having the product from the impurity concentrating section be of a purity substantially the same as the crystallizable material feed to Stage L. Generally speaking, the byproduct of the impurity concentrating section would constitute a small volume percentage of the feed thereto and would have a much higher concentration of impurities than its feed material, which is the byproduct from Stage L.

One difference between the operation of the impurity concentration system and a primary system of the type illustrated in FIGS. 1 and 2 is that the feed into the impurity concentrating system is to its stage that operates at its higher or highest purity, which is Stage A as illustrated in FIG. 3.

Stage B, the stage that operates with the lesser or least purity of materials, communicates with Stage A in substantially the same manner as adjacent stages in FIG. 1, FIG. 2 or the like. Mother liquor is transferred from purer Stage A to less pure Stage B through transfer means 61. Crystal material from Stage B moves to Stage A through transfer means 62. A desired quantity of product exits Stage A, while recycle crystal material re-enters Stage A via transfer means 63. A desired quantity of byproduct is removed from Stage B, while mother liquor recycle is carried out by way of a transfer means 64.

With more particular reference to the various controlling and/or metering functions and means that are discussed in conjunction with the various stages and transfers between them, the following controlling and/or metering aspects are preferred. During each cycle, substantially the same volume of reflux mother liquor should be transferred from each stage to the next lower numbered stage. During each cycle, substantially the same volume of recrystallized crystal material should be transferred from each stage to the next higher numbered stage. During each cycle, a controlled volume of recrystallized crystal material should be discharged from the purest stage as product of the refining system. During each cycle, a controlled volume of mother liquor should be discharged from the least pure stage as byproduct from the refining system. During each cycle, a volume of feed material that is substantially the same as the sum of the volumes of the product and byproduct passed out of the system should be introduced into the least pure stage of the primary system and/or into the purer or purest stage of the impurity concentrating system.

During each cycle, a sufficient amount of material, and typically an amount somewhat in excess thereof, must be recrystallized in order to provide at least enough crystal material to enable the proper volume of this material to be transferred from every stage to the next purer stage during each operating cycle. During each cycle, conditions within the crystallizer, including crystallization time, should be limited or otherwise controlled such that a sufficient volume of mother liquor remains in each crystallizer to enable the proper volume of mother liquor reflux to be transferred from each stage to the next lower numbered stage during each operating cycle.

The reflux ratio of a given section is the ratio of the weight per cycle of reflux solute (which is discharged from each stage of the system, monitored for example at the purest stage) to the weight per cycle of crystal product discharged from this same stage. The reflux ratio of the impurity concentrating system can be different from that of the primary recrystallization system, and the duration of each cycle for each of these systems may also be different. The reflux ratio can be controlled by regulating the volume of product removed from the system per cycle and the volume of reflux transferred from stage to stage. The percentage yield of superpure product that is recovered from the crystallizable material fed to the system is controlled by regulating the volume per cycle of product and of byproduct removed from the refining system. Generally speaking, the higher the reflux ratio (e.g. 1:1), the greater is the difference in purity per stage from one stage to the next purer stage, and the lower the reflux ratio (e.g. 0.5:1), the greater amount of product is produced each cycle.

With more particular reference to controlling the reflux ratio, this may be accomplished by controlling the weight of reflux solute that is transferred per unit of time from each stage to the next less pure stage, and by controlling the weight of crystal product from each stage which is transferred per unit of time from each stage to the next purer stage. In addition, the weight of crystal product which is produced per unit time can be indirectly controlled by controlling the weight per unit of time of crystals entering the purest stage and of reflux solute leaving that stage per unit time, with the difference between these entering crystals and the leaving reflux solute being the weight of crystal product. More specifically, two major factors which determine the reflux ratio of a system are controlled. These factors are the net weight of crystal product produced per cycle by the purest stage and the weight of mother liquor reflux solute transferred per cycle from this same stage to the next less pure stage.

By the indirect metering approach, the operator may meter the correct weight of reflux solute by withdrawing the proper volume of mother liquor to be used as reflux. The percentage of solute in the reflux is a function of its specific gravity, and monitoring same may be useful in providing the proper volume of reflux needed in order to result in having the correct weight of solute transferred as reflux. It may also be desirable and preferred to monitor and control the specific gravity of new solution made up during each stage when all of the crystals that have been added to that stage's crystal dissolver and the mother liquor therein are combined to make up such a new solution. The specific gravity can be adjusted as needed by either adding pure solvent to, or by evaporating solvent from the new solution. Specific gravity adjustments may be made in any stage's crystal dissolver by either the addition of pure solvent thereto or the evaporation of solvent therefrom.

Maintenance of a desirable steady state condition throughout the system is important. When this steady state condition is achieved, the system exhibits the following characteristics. The same weight of crystallizable material to be purified (or the major ingredient) is present in the crystallizer of each stage while crystallization is occurring. The same weight is present in the crystallizer of each stage during the crystallization period of each cycle. Each stage produces the same weight of crystal product during each cycle, which weight would be substantially the same as that of the feed introduced to the system. The same weight of product crystals are produced during each cycle. The same weight of byproduct solute is produced during each cycle. The weight of product per cycle is substantially the same as the weight of feed introduced per cycle minus the weight of byproduct solute produced per cycle. Each cycle has substantially the same reflux ratio.

Such steady state conditions are achieved and maintained according to the present invention by the following steps. Add the same weight of feed during each cycle of this system. Add the same weight of pure solvent to the purest stage during each cycle of the system, which weight should be just sufficient to produce the required amount of reflux that must be discharged from this stage during each cycle. Monitor and adjust the specific gravity of the new solution in the crystal dissolver or collector so that the specific gravity of each solution to be crystallized is the same in each stage Monitor and adjust the temperature of the solution to be crystallized and separated to insure that the crystallization temperature and the specific gravity of the mother liquor of each stage is the same during each cycle. All of the crystal product that is recrystallized in each stage is transferred to the crystal dissolver of the next purer stage during each cycle. The same volume of mother liquor reflux from each stage is transferred to the next less pure stage (or transferred as byproduct from the least pure stage). During each cycle, the crystal product is removed from the purest stage after pure solvent has been added to that stage to make up the new reflux for it.

When these conditions are maintained, the weight of crystals produced in each stage will be the same per cycle as the weight of feed introduced to the least pure stage during each cycle. Also, when steady state conditions such as these are maintained, the reflux ratio of the system will remain substantially the same during a series of cycles in a run.

A sufficient quantity of mother liquor holdup should be maintained in each stage in order to permit the production of an adequate weight of crystals per cycle in each stage. This needed weight is at least equal to or greater than the weight of feed introduced during each cycle.

When controlling the reflux ratio according to the present invention, it is necessary to control both the weight of product per cycle as well as the amount of reflux transferred. Regarding regulating the weight of crystal product, three controllable variables can be considered These are: feed introduced during each cycle, byproduct discharged each cycle, and crystal product discharged each cycle. By introducing the same weight and/or volume of material to each stage's crystallizers at the start of the crystallization period, control of any two of these variables will automatically regulate the third one. In all situations, the weight and/or volume of feed introduced per cycle is substantially equal to the sum of the weights and/or volumes of the product and byproduct discharged per cycle. In addition, the reflux transfer can be maintained by metering the mother liquor reflux that is transferred from each stage to the next less pure stage or by metering the recrystallized crystal material that is transferred from each stage to the next purer stage.

Accordingly, control of reflux ratio conditions can be accomplished according to the present invention by metering three different transfers. In a first case, the crystallizable material feed, the mother liquor byproduct and the mother liquor reflux are each metered. In a second case, the recrystallized product, the feed, and the reflux are metered. In a third case, the product, the byproduct and the reflux are metered. In a fourth case, the feed, the byproduct and the crystal material that is transferred from one stage to another are metered. In a fifth case, the product, the feed and the crystal material transfer are metered. In the sixth case, the product, the byproduct and the crystal material transfer are each metered.

The procedure and apparatus according to the present invention are suitable for superpurification of various crystallizable salts within solvents therefor, such as water, alcohols, ethers, ketones, and the like. Exemplary recrystallizable materials in this regard include sodium chloride, potassium chloride, cesium chloride, barium nitrate, copper nitrate, sodium iodide, barium chloride, copper sulfate, nickel sulfate, alum (ammonium aluminum sulfate), ammonium molybdate, and the like. The following examples illustrate some specific procedures suitable for these types of materials.

EXAMPLE 1

An impurity stripping system of the type generally illustrated in FIG. 1 but including six stages, rather than the four stages illustrated in that drawing was run for the production of 8.46 kilograms per cycle of superpure cesium chloride crystals and 4.23 kilograms of impure cesium chloride solute byproduct from 12.7 kilograms per cycle of technical grade cesium chloride crystal feed material. The solvent utilized was water. The operator of this system could maintain or change the reflux ratio, depending upon the particular objectives of each cycle.

First, initial calibration or startup cycles were run. Before the start of the first cycle of the calibration operation, 35.86 kilograms of technical grade cesium chloride feed and 13.26 liters of distilled water were added to the collector of each stage. The system was then run for twelve cycles at a reflux ratio of 1 to 0 in order to achieve a normal operating distribution of impurities in the system before normal operation is begun. Thereafter, the reflux ratio was changed to 1 to 0.5 for each cycle.

During the startup of 1 to 0 reflux ratio cycles, the crystal dissolver containers or collectors were heated to boiling, approximately 118° C., until all crystals were dissolved. In those stages where the specific gravity needed adjustment, either distilled water was added to lower the specific gravity, or additional evaporation was carried out to increase the specific gravity so that the crystallization temperature of the solution in each stage was as close as possible to 100° C. Crystallization was then carried out over a two hour period during which the temperature was lowered to 10° C., and very close to 12.7 kilograms of cesium chloride crystals were formed in each stage. After separation of these crystals from the mother liquor, 19.97 kilograms of mother liquor were transferred from each stage's mother liquor receiver to that same stage's metering reflux receiver. This transferred mother liquor contained 12.7 kilograms of cesium chloride solute for each stage.

The separated crystals were then washed while being spun in a centrifuge of the separator of each stage, the washing being with the reflux mother liquor from the reflux receiver of the next purer stage. In addition to washing the crystals, this step also transferred the reflux from each stage to the next less pure stage. Since there was no reflux which entered the highest numbered stage, the crystals of that stage were not washed. The result of this washing step is that the composition of any mother liquor which still wets the crystals of any given stage after the washing step had substantially the same composition as the mother liquor of the next purer stage to which those crystals were subsequently transferred.

Transfer of crystals was next effected, with 12.7 kilograms of washed crystals transferred to the crystal dissolving container or collector of the next purer stage, except in the case of the purest stage. Because these early cycles were of a startup or calibration nature and at a 1 to 0 reflux ratio, the recrystallized crystals of the purest stage were transferred to the crystal dissolver or collector of that same stage, and 7.27 kilograms of water were added thereto to enable all of the crystals to dissolve.

The mother liquor holdup in the mother liquor receiver of each stage was returned to the collector of each stage, and water was evaporated from the least pure crystal dissolver or collector until the specific gravity of the solution increased to a point that it achieved a crystallization temperature of 100° C.

This procedure was run through twelve consecutive cycles. For all cycles thereafter, the reflux ratio was modified to what had been determined to be an advantageous reflux ratio of 1 to 0.5. 12.7 kilograms of cesium chloride feed to be superpurified was introduced into the crystal dissolver or collector of the least pure stage, 8.46 kilograms of superpure product having a purity of 99.999 percent were transferred from the purest stage during each cycle, and 4.23 kilograms of byproduct solute were withdrawn from the least pure stage during each cycle.

The procedure followed for each cycle was as carried out during the calibration cycles, with the following modifications. 6.65 kilograms of mother liquor were withdrawn from the mother liquor receiver and transferred to the metering reflux receiver of each stage. This known quantity of mother liquor reflux had a crystallization temperature of 10° C. and contained 4.23 kilograms of cesium chloride solute and 2.42 kilograms of water solvent. The contents of the reflux receiver of the least pure stage were discharged as byproduct. For the other stages, the 6.65 kilograms of reflux were transferred to wash the recrystallized crystals of the next less pure stage. The recrystallized crystals of the purest stage were washed with 2.42 kilograms of warm distilled water, and these crystals were removed from the system as 8.46 kilograms of product. The recrystallized crystals of the other stages were transferred to the crystal dissolver or collector of the next purer stage. There was no need to boil down the least pure stage. Instead, another 12.7 kilograms of cesium chloride feed material were added.

During these non-calibration or operational cycles, steady state conditions were established and maintained in each of the stages. These steady state conditions include having the same holdup weight of cesium chloride, 35.56 kilograms, in each crystal dissolver or collector at the end of each cycle of each run. The same weight, 12.7 kilograms, of cesium chloride crystals were formed in each stage's crystallizer during each cycle of each run. The same weight, 8.46 kilograms, of cesium chloride product were produced during each cycle.

The reflux ratio was controlled at 1 to 0.5 during each cycle of the run, such having been made possible by the establishment of these steady state conditions and by direct regulation of the weight of feed introduced per cycle and the rate of reflux transferred from stage to stage in the system. This regulation, in turn, controlled the weight of product that was produced per cycle.

EXAMPLE 2

An impurity concentrating system of the type generally illustrated in FIG. 3 was run, except it was of the 3-stage variety. This system was used to process the cesium chloride byproduct solution produced according to Example 1. This impurity concentrating system recovered 75 percent of the solute as a crystal product having substantially the same purity as the feed material into the Example 1 system. The remaining 25 percent of this feed solute was converted to a very impure solute that contained substantially all of the impurities that were in the feed material. The byproduct solution from Example 1 that was the feed into this impurity concentrating system had a crystallization temperature of 10° C. and contained approximately 63.6 weight percent of cesium chloride solute. A typical solute in this regard also contained about 500 ppm sodium chloride and about 5,000 ppm rubidium chloride by weight.

The crystal dissolver of each stage of the impurity concentrating system was filled with 33.3 kilograms of the feed and thus 21.19 kilograms cesium chloride solute and 12.12 kilograms water. Adjustment of the specific gravity to indicate a crystallization temperature of 100° C. required evaporation of the water to 7.83 kilograms.

Crystallization produced 7.5 kilograms of cesium chloride crystals for each stage, and the mother liquor and crystals were separated as described in Example 1. 7.47 kilograms of mother liquor were transferred from the purest stage mother liquor receiver to its reflux receiver, and 4.37 kilograms of the least pure mother liquor were transferred to its reflux receiver Crystal washing took place, and 7.5 kilograms of washed crystals in the purest stage were removed as product of the impurity concentrating section. 7.5 kilograms of washed crystals from the least pure stage were transferred to the next purer stage.

Boildown was effected in the least pure crystal dissolver, same containing 33.3 kilograms of solution that had 21.17 kilograms of cesium chloride solute and 12.12 kilograms of water which were reduced to 7.83 kilograms of water. After boildown, 29 kilograms of new solution having a crystallization temperature of approximately 100° C. were present. Crystal dissolving within the purer stages provided 33.3 kilograms of new solution which included 21.17 kilograms of cesium chloride solute and 12.12 kilograms of water.

Additional cycles which were identical to this first one were conducted to continue the production of 7.5 kilograms of crystal product per cycle and 2.5 kilograms of impure cesium chloride solute per cycle. After several cycles, the impurity distribution in the stages of this impurity concentration section reached an equilibrium condition. When equilibrium was reached, the byproduct solute contained almost four times the concentration of impurities as the feed solute. The reflux ratio of the impurity concentrating section was 1 to 0.75.

It will be understood that the embodiments of the present invention which have been described are illustrative of some of the applications of the principles of the present invention. Numerous modifications may made by those skilled in the art without departing from the true spirit and scope of the invention.

I claim:

1. A method for superpurifying crystallizable substances by a multistage recrystallization procedure which includes controlling reflux ratio conditions, comprising:

providing a plurality of stages having vessels with crystallizable substances therein and operating said stages by proceeding with a sequence of steps in a cyclic manner through a plurality of substantially duplicate cycles conducted substantially simultaneously during each stage such that the crystallizable substance in each stage is dissolved and recrystallized within each such stage, one of said stages being a least pure stage during which a controlled quantity of crystallizable substance to be superpurified is added from outside of the plurality of stages as feed to a vessel of the least pure stage, another of said stages being a purest stage during which solvent which does not contain and is different from said crystallizable substance is added to said purest stage from outside of the plurality of stages, the sequence of steps comprising:

(a) dissolving within a collector vessel crystallizable substance to be recrystallized, said crystallizable substance for the least pure stage being said feed of crystallizable substance to be superpurified, and said crystallizable substance for the remaining stage or stages having been recrystallized in a next less pure stage, whereby this crystallizable substance and mother liquor from the stage being subjected to the dissolving step are combined in said stage, the mother liquor being composed principally of said solvent, to thereby dissolve the crystallizable substance within the solvent and form a saturated separate new solution within the collector vessel, said saturated separate new solution being one in which all of the crystallizable substance is dissolved in said solvent;

(b) transferring said saturated separate new solution of each stage from the collector vessel to a crystallizer vessel;

(c) recrystallizing said crystallizable substance in the crystallization vessel of each stage, said recrystallizing step including lowering the temperature of said saturated separate new solution to a selected temperature at which the crystallizable substance thereof recrystallizes in order to thereby form a quantity of crystal slurry in each said stage, said crystal slurry including thus recrystallized crystals;

(d) transferring said crystal slurry to a separator vessel of that stage;

(e) separating within the separator vessel said crystal slurry into separated recrystallized crystals and separated mother liquor;

(f) transferring a controlled quantity of said separated mother liquor separated in step (e) to a reflux vessel of that stage, and transferring any remainder of said separated mother liquor to the collector vessel of that stage, whereby substantially only said separated recrystallized crystals remain in the separator vessel;

(g) when said stage is said least pure stage, said controlled quantity of separated mother liquor of step (f) is a byproduct transferred out of the plurality of stages;

(h) when said stage is a stage other than said least pure stage, the controlled quantity of mother liquor provided to the reflux vessel in step (f) is transferred to the separator vessel of the next less pure stage whereby said separated recrystallized crystals in said separator vessel are washed with mother liquor purer than the mother liquor of said next less pure stage;

(i) transferring a controlled quantity of said recrystallized crystals separated in step (e) to the collector vessel of the next purer stage, which recrystallized crystals are the crystallizable substance of step (a) except that said step (i) transferring step of the purest stage transfers the controlled quantity of recrystallized crystals out of the plurality of stages as a superpurified recrystallized crystal product, and transferring any remainder of said recrystallized crystals separated in step (e) to the collector vessel of that stage; and (j) controlling the reflux ratio of the multistage recrystallization procedure by metering the controlled quantity of mother liquor that is transferred during step (f) and by controlling the recrystallized crystal product transferred from the purest stage during step (i).

2. The method according to claim 1, wherein said crystal product has a purity of about 99.999 percent.

3. The method according to claim 1, wherein temperature conditions are substantially the same within each said stage.

4. The method according to claim 1, wherein the system includes between about two and about ten stages.

5. The method according to claim 1, wherein each controlled quantity of mother liquor and crystals that moves between stages is substantially the same irrespective of the stage from which or to which movement is effected.

6. The method according to claim 1, further including transferring the crystals separated in step (e) to a crystal receiver for carrying out step (i).

7. The method according to claim 1, further including adjusting the specific gravity of new solution in each collector prior to step (c).

8. The method according to claim 1, wherein said step of controlling reflux ratio includes adding, removing and/or transferring the same quantities of crystallizable material feed crystals, mother liquor, byproduct, wash, and product in each stage of the system and throughout each cycle thereof, and maintaining the same temperature conditions in each stage and each cycle.

9. The method according to claim 1, wherein said controlling of the product discharged from the system includes controlling any two of crystallizable material feed introduced each cycle, byproduct discharged each cycle and product discharged each cycle.

10. The method according to claim 1, wherein said step (j) metering of said controlled quantity of mother liquor is indirectly controlled by metering recrystallizable crystal material that is transferred from each stage to the next purer stage.

11. The method according to claim 1, wherein said controlling of the product discharged from the system includes controlling any two of crystallizable material feed introduced each cycle, byproduct discharged each cycle and product discharged each cycle, and wherein said step (j) metering of said controlled quantity of mother liquor is indirectly controlled by metering recrystallizable crystal material that is transferred from each stage to the next purer stage.

12. The method according to claim 1, further including an impurity concentrating system having a plurality of concentration stages for further processing said step (g) byproduct, said impurity concentrating system including a purest concentration stage and a least pure concentration stage; wherein feed into the impurity concentrating system is into said purest concentration stage, byproduct out of the impurity concentrating system is from said least pure concentration stage, and concentration product out of the impurity concentrating system is from said purest concentration stage, said concentration product being purer than said step (g) byproduct; and wherein each said concentration stage dissolves the crystallizable substance, recrystallizes same, separates into crystals and mother liquor, transfers a controlled quantity of mother liquor to a stage of next lesser purity, and transfers crystals to a stage of next greater purity.

13. An apparatus for superpurifying crystallizable substances by a cyclic multistage recrystallization procedure, comprising:

a plurality of stages having components including collector means for each stage, said stages proceeding through substantially duplicate cycles conducted substantially simultaneously within each stage and including a least pure stage and a purest stage;

means for adding a controlled quantity of crystallizable substance to the collector means of the least pure stage;

means for adding a solvent for a crystallizable substance to said purest stage, said solvent being different from and does not contain the crystallizable substance;

means for dissolving crystallizable substance within mother liquor including said solvent therefor to form a saturated new solution within each collector means;

means for recrystallizing substantially all of the crystallizable substance in each saturated new solution by lowering the temperature of each said saturated new solution of each stage to a selected temperature at which the crystallizable substance crystallizes from the new solution in order to form a quantity of crystal slurry in each said stage, said crystal slurry including thus recrystallized crystals;

means for separating said crystal slurry of each of said stages into recrystallized crystals and mother liquor and for transferring the separated mother liquor to a mother liquor receiver of each said stage;

reflux means of each said stage, said reflux means being downstream of and being for metering a controlled quantity of mother liquor from the mother liquor receiver of its stage to thereby provide a controlled quantity of mother liquor;

means for transferring said controlled quantity of mother liquor of each stage except for said least pure stage to the next less pure stage and for washing said recrystallized crystals of that next less pure stage with mother liquor from a purer stage;

means for transferring said controlled quantity of mother liquor from the least pure stage and for thus providing a controlled quantity of byproduct;

means for moving a controlled quantity of the recrystallized crystals from said separating means, except for those of the purest stage, to said collector of the next purer stage;

means for collecting a controlled quantity of the recrystallized crystals from said separating means of the purest stage as a controlled quantity of superpurified crystal product;

means for passing residual mother liquor from said mother liquor receiver of each stage to the collector of that same stage, the residual mother liquor being mother liquor in excess of that controlled quantity of mother liquor metered by said reflux means; and means for controlling the reflux ratio of the multistage apparatus, said controlling means including said reflux means and said means for collecting the controlled quantity of superpurified product, said controlling means further including means for maintaining steady state conditions within and between each stage of said system.

14. The apparatus according to claim 13, wherein each said means for transferring said controlled quantity of mother liquor to the next less pure stage is a means for wash transferring a controlled quantity of mother liquor passed to the mother liquor receiver of stages other than said least pure stage to the separating means of the next less pure stage.

15. The apparatus according to claim 13, further including means for maintaining substantially equal temperature conditions within each respective component of each said stage.

16. The apparatus according to claim 13, wherein the apparatus includes between two and about ten of said stages.

17. The apparatus according to claim 13, wherein said crystals moving means includes a crystal receiver vessel separate from said separating means.

18. The apparatus according to claim 13, further including means for adjusting the specific gravity of the new solution slurry within each collector means.

19. The apparatus according to claim 14, wherein said steady state condition maintaining means includes means for controlling said transferring means, said wash transferring means, said moving means and said collecting means, whereby each said means controls movement of substantially equal quantities of respective materials between each of said plurality of stages.

20. The apparatus according to claim 13, further including an impurity concentrating system having a plurality of concentration stages for further processing the byproduct from said least pure stage, said impurity concentrating system includes a purest concentration stage and a least pure concentration stage, feed input means for passing the byproduct of said least pure stage into said purest concentration stage, output means for removing byproduct from said least pure concentration stage, and product outflow means for removing concentration product from said purest concentration stage, said concentration product being purer than said byproduct from said least pure stage; and wherein each of said concentration stages includes means for dissolving the byproduct of the least pure stage, means for recrystallizing same, means for separating same into crystals and mother liquor, means for transferring a controlled quantity of mother liquor to a stage of next lesser purity, and means for transferring crystals to a stage of next greater purity.

21. The method according to claim 1, wherein said step of transferring a controlled quantity of mother liquor includes moving mother liquor to a reflux receiver of each such stage prior to said step which provides a controlled quantity of mother liquor that washes the crystals of the next less pure stage.

22. The apparatus according to claim 14, wherein said transferring means includes a reflux receiver vessel separate from said mother liquor receiver.

* * * * *

UNITED STATES PATENT AND TRADEMARK OFFICE
CERTIFICATE OF CORRECTION

PATENT NO. : 5,127,921
DATED : July 7, 1992
INVENTOR(S) : Kenneth F. Griffiths

It is certified that error appears in the above-indentified patent and that said Letters Patent is hereby corrected as shown below:

On the title page, item [56]:
   In References Cited line reading "3,992,900  11/1978  Campbell...62/541"
       should read --3,992,900  11/1976  Campbell...62/541--; line
       reading "4,588,414  5/1986  Takeyami et al. ...23/295R" should
       read --4,588,414  5/1986  Takegami et al. ...23/295R--.
Col. 2, line 4, delete --a--.
Col. 3, line 7, "operates a" should read --operates at--; line 32,
       "will clearly" should read --will be clearly--.
Col. 8, line 52, "(e.g. 0.5:1)." should read --(e.g. 0.5:1),--;
       line 53, "product is produced" should read --product produced--.
Col. 9, line 51, "stage" should read --stage.--.
Col. 13, line 3, "receiver" should read --receiver.--; lines 33-34,
       "may made" should read --may be made--.

Signed and Sealed this

First Day of November, 1994

*Attest:*

*Attesting Officer*

BRUCE LEHMAN

*Commissioner of Patents and Trademarks*